United States Patent
Spector et al.

(10) Patent No.: US 10,636,918 B2
(45) Date of Patent: Apr. 28, 2020

(54) SINGLE ELECTRON TRANSISTOR TRIGGERED BY PHOTOVOLTAIC DIODE

(71) Applicant: The Charles Stark Draper Laboratory, Inc., Cambridge, MA (US)

(72) Inventors: Steven J. Spector, Lexington, MA (US); Robin Mark Adrian Dawson, Waltham, MA (US); Michael G. Moebius, Somerville, MA (US); Benjamin F. Lane, Sherborn, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 21 days.

(21) Appl. No.: 16/169,022

(22) Filed: Oct. 24, 2018

(65) Prior Publication Data

US 2019/0131467 A1 May 2, 2019

Related U.S. Application Data

(60) Provisional application No. 62/577,250, filed on Oct. 26, 2017.

(51) Int. Cl.
| | |
|---|---|
| *H01L 31/02* | (2006.01) |
| *H01L 31/028* | (2006.01) |
| *H01L 31/111* | (2006.01) |
| *G01J 1/02* | (2006.01) |
| *G01T 1/24* | (2006.01) |

(Continued)

(52) U.S. Cl.
CPC .......... *H01L 31/02027* (2013.01); *G01J 1/02* (2013.01); *G01T 1/248* (2013.01); *H01L 31/028* (2013.01); *H01L 31/107* (2013.01); *H01L 31/111* (2013.01); *H01L 29/7313* (2013.01); *H04B 10/70* (2013.01)

(58) Field of Classification Search
CPC ............. H01L 31/02027; H01L 31/111; H01L 31/028; H01L 31/107; H01L 29/7313; G01T 1/248; G01J 1/02; H04B 10/70
See application file for complete search history.

(56) References Cited

U.S. PATENT DOCUMENTS

| 9,391,225 B1 | 7/2016 | Davids et al. |
| 10,388,816 B2 * | 8/2019 | Rae .................. H01L 31/02027 |
| 2010/0013458 A1 | 1/2010 | Lany et al. |

FOREIGN PATENT DOCUMENTS

| JP | H0220918 | 1/1990 |
| JP | 2011-171489 | 9/2011 |

OTHER PUBLICATIONS

Lany, et al., "Electron counting at room temperature in an avalanche bipolar transistor," Applied Physics Letters, vol. 92, pp. 022111-022113, Jan. 18, 2008.

(Continued)

*Primary Examiner* — Tony Ko
(74) *Attorney, Agent, or Firm* — Sunstein LLP

(57) ABSTRACT

A single photon detection circuit is described that includes a germanium photodiode that is configured with zero voltage bias to avoid dark current output when no photon input is present and also is configured to respond to a single photon input by generating a photovoltaic output voltage. A single electron bipolar avalanche transistor (SEBAT) has a base emitter junction connected in parallel with the germanium photodiode and is configured so that the photovoltaic output voltage triggers an avalanche collector current output.

9 Claims, 2 Drawing Sheets

(51) Int. Cl.
*H01L 31/107* (2006.01)
*H04B 10/70* (2013.01)
*H01L 29/73* (2006.01)

(56) References Cited

OTHER PUBLICATIONS

DeRose, et al., "Ultra compact 45 GHz CMOS compatible Germanium waveguide photodiode with low dark current," Optics Express, vol. 19, No. 25, pp. 24897-24904, Nov. 22, 2011.
Liu, et al., "High-performance, tensile-strained Ge p—i—n photodetectors on a Si platform," Applied Physics Letters, vol. 87, p. 103501-3, Aug. 29, 2005.
Anonymous (SHARP Corporation), "Photodiode/Phototransi stor application circuit," SHARP Corporation, 7 pages, Jan. 1, 1999.
Cova, et al., "Avalanche photodiodes and quenching circuits for single-photon detection," Applied Optics, vol. 35, No. 12, pp. 1956-1976, Apr. 20, 1996.
European Patent Office as the International Searching Authority, Authorized Officer: Anke Döring, International Search Report and Written Opinion of the International Searching Authority, PCT/US2018/057215, dated Feb. 12, 2019, 52 pages.

* cited by examiner

SINGLE ELECTRON TRANSISTOR TRIGGERED BY PHOTOVOLTAIC DIODE

This application claims priority from U.S. Provisional Patent Application 62/577,250, filed Oct. 26, 2017, which is incorporated herein by reference in its entirety.

TECHNICAL FIELD

The present invention relates to a single photon detection circuit suitable for detection of longer wavelength (infrared) input photons.

BACKGROUND ART

Single photon detection circuits are useful for a number of applications such as LiDAR, photoluminescence or fluorescence detection, and quantum information. One approach to detect single photons uses what is referred to as a single photon avalanche diode (SPAD), also sometimes called a Geiger-mode avalanche photodiode (GmAPD). In a SPAD, a photodiode is biased beyond breakdown and a single photon is all that is necessary to trigger the breakdown of the diode and create a large current that is easily detected.

SPAD technology has the advantage of being semiconductor based so that it is compact, cheap, and reliable. The best SPAD devices, by far, are made of silicon, however, silicon SPADs have significant wavelength limitations. Due to the band edge of silicon, silicon SPADs only function at wavelengths <1000 nm, and also often are not very efficient at detection of the longer wavelengths within this range (in the near infrared).

To make a SPAD that is usable at longer wavelengths, indium gallium arsenide (InGaAs)/indium phosphide (InP) devices have been used instead of silicon. However, InGaAs/InP SPADs are dramatically inferior to Si SPADs, with much higher dark count rates (output current when no photo-input exists), they do not operate at room temperature, and they are susceptible to after-pulsing while still having relatively low efficiencies of around 10%-20%. in additional, InGaAs/InP devices are significantly more expensive to fabricate than silicon devices.

Other single photon detection approaches include photomultiplier tubes and superconducting nanowire single-photon detectors (SNSPD). But photomultiplier tubes are bulky devices requiring very high voltages to operate. And while SNSPD offer the best performance of any single photon detector, they also require cooling below 10° K. Attempts also have been made to directly fabricate SPADs using germanium, but those devices have extremely high dark count rates, making them unsuitable for most applications.

SUMMARY

Embodiments of the present invention are directed to a single photon detection circuit that includes a germanium photodiode configured with zero voltage bias to avoid dark current output when no photon input is present and also configured to respond to a single photon input by generating a photovoltaic output voltage and current. A single electron bipolar avalanche transistor (SEBAT) has a base emitter junction connected in parallel with the germanium photodiode and is configured so that the photovoltaic output voltage triggers an avalanche collector current output.

Further specific embodiments may also include an output quenching circuit that is connected to the SEBAT collector and configured to respond to the avalanche collector current by producing an output detection pulse and resetting the SEBAT for triggering by the germanium photodiode. For example, the output quenching circuit may be a high impedance passive circuit or a high impedance active circuit. Some embodiments may also include an input switching circuit configured engage and disengage the germanium photodiode during alternating time periods.

The SEBAT may be formed of silicon material. The germanium photodiode may be formed using germanium material used as deposited plus any dopings and anneals needed to turn it into a photodiode. In some embodiments, the germanium material may be modified by pulse laser hyperdoping and/or ion implantation. And the germanium photodiode may be configured to respond to a single photon input having a wavelength of 650 nm-1550 nm without modification, and to longer wavelengths with modification.

DETAILED DESCRIPTION

Various embodiments of the present invention are directed to a single photon detector that includes a germanium photodiode in combination with a single electron bipolar avalanche transistor (SEBAT). The resulting single photon detection circuit has excellent sensitivity, can operate at room temperature, has low dark counts, is silicon/CMOS process compatible, and is sensitive to wavelengths from about 700-1550 nm (wavelengths from 1400-1550 nm are of particular interest in LiDAR applications for eye-safety reasons).

Figure 1:
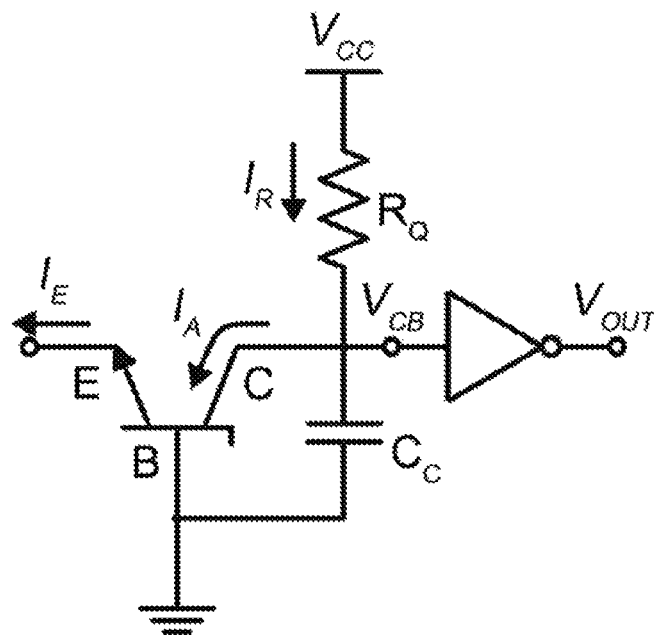
FIG. 1 shows an example of a single electron bipolar avalanche transistor (SEBAT) circuit.

FIG. 1 shows an example of a single electron bipolar avalanche transistor (SEBAT) circuit as described in M. Lany, G. Boero and R. Popovic, "Electron counting at room temperature in an avalanche bipolar transistor," Applied Physics Letters, vol. 92, p. 022111, 2008; and E. A. Webster, J. A. Richardson, L. A. Grant and R. K. Henderson, "A single electron bipolar avalanche transistor implemented in 90 nm CMOS," Solid State Electronics, vol. 76, pp. 116-118, 2012 (both of which are incorporated herein by reference in their entireties). Unlike SPADs, which are triggered by single photons, SEBATs are triggered by single electrons. For single electron detection operation, the collector voltage $V_{cc}$ is set to a high voltage above the breakdown of the collector-base junction. If a negative voltage is applied to the emitter E, the base-emitter junction is forward biased and an emitter current $I_E$ appears. Part of this emitter current includes emitter electrons that overcome the potential barrier between the emitter and the base and reach the collector-base junction. Once at the collector-base junction, any free electron will be accelerated by the strong electric field and is very likely to generate secondary electron-hole pairs by impact ionization, which in turn generate more secondary electron-hole pairs, thereby beginning the cascade of breakdown. The combination of the resistor $R_Q$ and capacitor $C_C$ creates an output quenching circuit that develops an output voltage pulse and resets the SEBAT after breakdown.

Embodiments of the present invention are directed to a single photon detection circuit that adds a germanium photodiode in parallel with the base-emitter junction of the SEBAT. The germanium photodiode provides sensitivity to long wavelength photons while the SEBAT provides the high performance triggering of a silicon device. The germanium photodiode is configured with zero voltage bias to avoid dark current output when no photon input is present. This is important because any voltage bias would lead to significant dark current (and a large number of dark detections), negating an important advantage of the invention. The zero voltage bias operates the germanium photodiode in photovoltaic mode so as to respond to a single photon input by generating a corresponding photovoltaic output voltage. Because the base emitter junction of the SEBAT is connected in parallel with the germanium photodiode, the photovoltaic output voltage triggers an avalanche collector current output from the SEBAT collector.

Figure 2:
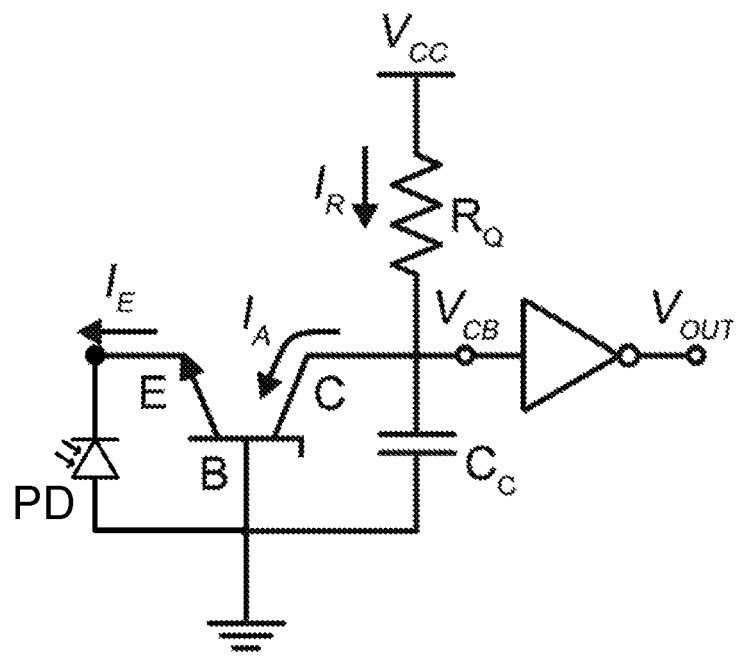
FIG. 2 shows an embodiment of the present invention in which a zero bias germanium photodiode is connected in parallel with the base-emitter junction of the SEBAT of FIG. 1.

Further specific embodiments may also include an output quenching circuit that is connected to the SEBAT collector and configured to respond to the avalanche collector current by producing an output detection pulse and resetting the SEBAT for triggering by the germanium photodiode. For example, the output quenching circuit may be a high impedance active circuit as shown in FIGS. 1 and 2 where the collector-base voltage $V_{CB}$ is developed as the output detection pulse by series elements resistor $R_Q$ and capacitor $C_C$, and then amplified into an output voltage $V_{OUT}$. In other specific embodiments, the output quenching circuit could be a high impedance passive circuit.

It is known that the SEBAT base-emitter voltage needs to be >0.4V to overcome parasitic current sources and reliably trigger an avalanche current. At a photon wavelength of 1550 nm, the maximum voltage the photo-generated electron can have is 0.8V. C. T. DeRose, D. C. Trotter, W. A. Zortman, A. L. Starbuck, M. Fisher, M. R. Watts and P. S. Davids, "Ultra compact 45 GHz CMOS compatible Germanium waveguide photodiode with low dark current," Optics Express, vol. 19, pp. 24897-24903, 2011, (incorporated herein by reference in its entirety) has shown that in an actual circuit, a germanium photodiode actually provides less than this, but even so still provides 0.4V, which is sufficient for this use. DeRose also showed that a germanium photodiode can have good efficiency (no specific value was given, but FIG. 5a therein is flat through no bias) and speed (37 GHz) with no bias. This achieves good speed and sensitivity performance in use for a single photon detection circuit as described herein.

The photodiode in DeRose is waveguide coupled. Normally incident photodiodes, such as demonstrated in J. Liu, J. Michel, W. Giziewicz, D. Pan, K. Wada, D. D. Cannon, S. Jongthammanurak, D. T. Danielson, L. C. Kimerling, J. Chen, F. Ö. Ilday, F. X. Kärtner and J. Yasaitis, "High-performance, tensile-strained Ge p-i-n photodetectors on a Si platform," Applied Physics Letters, vol. 87, p. 103501, 2005 (incorporated herein by reference in its entirety) are also suitable.

Although use of a germanium photodiode does extend the wavelength range of the device, still germanium absorption drops off rapidly for wavelengths >1550 nm. So the entire telecommunications band cannot be covered using a germanium-based photodetector. For silicon-based devices, pulsed laser, hyperdoping, and ion implantation have been used to dramatically extend the absorption region of the silicon material into the infrared band. More recently, similar work has been done for germanium materials using combinations of ion implantation and pulsed laser melting, femtosecond pulse laser hyperdoping and thermal annealing, and nanosecond pulse laser hyperdoping and thermal annealing to modify the properties of semiconductors to lead to sub-bandgap optical and electrical response as well as increased detector quantum efficiency. Combining these approaches with a germanium SEBAT can be used for a single photon counting circuit over a broader bandwidth than is possible with unmodified germanium.

Figure 3:
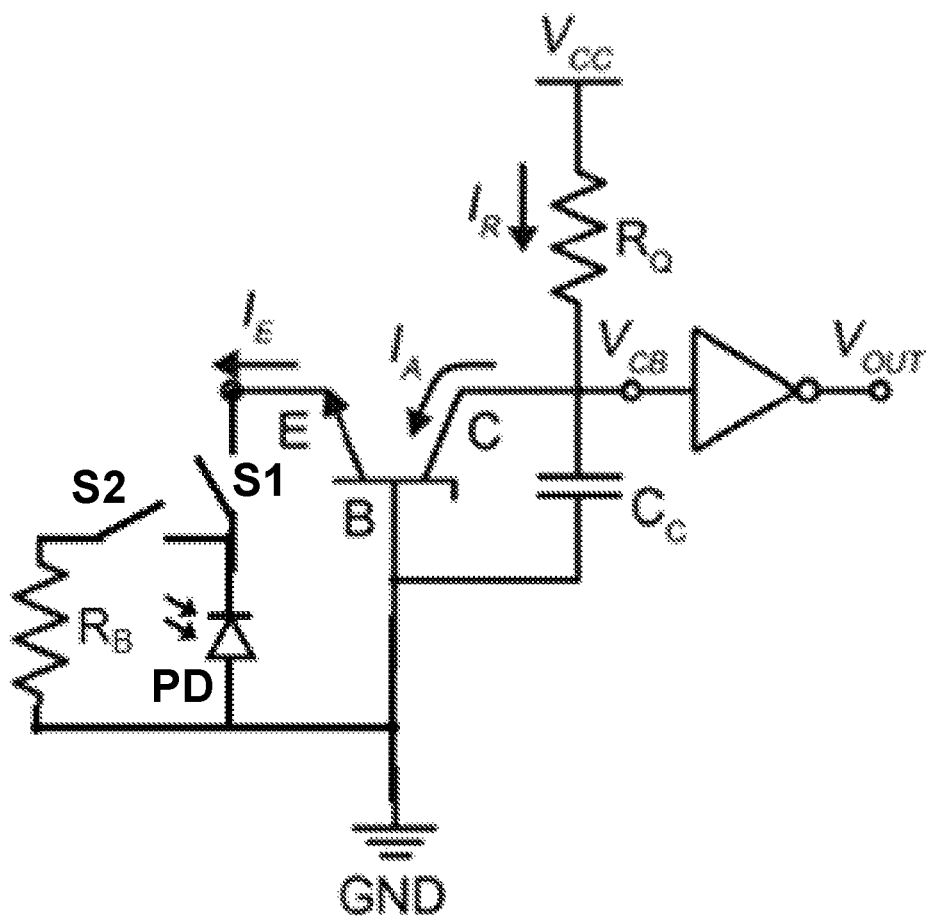
FIG. 3 shows an embodiment of the present invention with an additional switching arrangement to rapidly to the circuit on and off.

In some applications, the photodiode needs to be blind (or avoid triggering) during some timeframes, and then be rapidly turned on for other time frames. For example, this can be very important in a LiDAR system to avoid triggering from light scattered off a near field optic such as a lens or glass protector. FIG. 3 shows an example of an embodiment that implements this functionality by adding switches S1 and S2 (The switches shown are understood as being notional and would likely actually be implemented using a solid-state circuit). FIG. 3 shows both switches S1 and S2 as being open, but in operation, one would be closed at all times, while the other is open. For example, if S2 is closed and S1 is open, then the photodiode PD is shunted and triggering is avoided, regardless of how much light actually enters the photodiode. Then when S2 open and S1 is closed, the circuit acts normally and triggering can occur. Such switches can operate at standard CMOS voltages and can be quite fast. This is in contrast to the alternative, which is rapidly changing the collector voltage Vcc to alter the bias on the avalanche diode, which is a more challenging and slower process due to the high voltage of Vcc, (~48V in the referenced example) and the RC time delay of the circuit.

Although various exemplary embodiments of the invention have been disclosed, it should be apparent to those skilled in the art that various changes and modifications can be made which will achieve some of the advantages of the invention without departing from the true scope of the invention.

What is claimed is:

1. A single photon detection circuit comprising:
    a germanium photodiode configured with zero voltage bias to avoid dark current output when no photon input is present and configured to respond to a single photon input by generating a photovoltaic output voltage; and
    a single electron bipolar avalanche transistor (SEBAT) having a base, emitter and collector with a base emitter junction connected in parallel with the germanium photodiode and configured so that the photovoltaic output voltage triggers an avalanche collector current output.

2. The detection circuit of claim 1, further comprising:
    an output quenching circuit connected to the SEBAT collector and configured to respond to the avalanche collector current by producing an output detection pulse and resetting the SEBAT for triggering by the germanium photodiode.

3. The detection circuit of claim 2, wherein the output quenching circuit is a high impedance passive circuit.

4. The detection circuit of claim 2, wherein the output quenching circuit is a high impedance active circuit.

5. The detection circuit of claim 1, further comprising:
    an input switching circuit configured to engage and disengage the germanium photodiode during alternating time periods.

6. The detection circuit of claim 1, wherein the germanium photodiode is configured to respond to a single photon input having a wavelength of 750 nm-1500 nm.

7. The detection circuit of claim 1, wherein the SEBAT is formed of silicon material.

8. The detection circuit of claim 1, wherein the germanium photodiode is formed using germanium material modified by pulse laser hyperdoping.

9. The detection circuit of claim 1, wherein the germanium photodiode is formed using germanium material modified by ion implantation.

\* \* \* \* \*